(12) United States Patent
Jeong et al.

(10) Patent No.: US 12,227,373 B2
(45) Date of Patent: Feb. 18, 2025

(54) ARTICLE TRANSPORT VEHICLE, RAIL ASSEMBLY, AND ARTICLE TRANSPORT SYSTEM INCLUDING THE SAME

(71) Applicant: SEMES CO., LTD., Cheonan-si (KR)

(72) Inventors: Wan Hee Jeong, Hwaseong-si (KR); Kuk Saeng Kim, Yongin-si (KR); Do Youn Lim, Hwaseong-si (KR); Noh Hoon Myoung, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 65 days.

(21) Appl. No.: 18/090,513

(22) Filed: Dec. 29, 2022

(65) Prior Publication Data

US 2023/0211966 A1  Jul. 6, 2023

(30) Foreign Application Priority Data

Dec. 30, 2021  (KR) .................. 10-2021-0192607

(51) Int. Cl.
*B65G 54/02* (2006.01)
*H01L 21/677* (2006.01)

(52) U.S. Cl.
CPC ........ *B65G 54/02* (2013.01); *H01L 21/67709* (2013.01); *H01L 21/67724* (2013.01); *H01L 21/67727* (2013.01); *H01L 21/67733* (2013.01); *B65G 2201/0297* (2013.01)

(58) Field of Classification Search
CPC ............ B65G 54/02; B65G 2201/0297; B65G 43/00; H01L 21/67709; H01L 21/67724; H01L 21/67727; H01L 21/67733
See application file for complete search history.

(56) References Cited

U.S. PATENT DOCUMENTS

| | | | | |
|---|---|---|---|---|
| 3,847,085 A | * | 11/1974 | Rypinski ................. | B61B 15/00 104/89 |
| 5,628,252 A | * | 5/1997 | Kuznetsov .............. | B60L 13/10 104/284 |
| 6,361,268 B1 | * | 3/2002 | Pelrine .............. | H01L 21/67709 414/749.2 |
| 7,380,508 B2 | * | 6/2008 | Li ........................... | B60L 13/06 104/284 |
| 8,701,864 B2 | * | 4/2014 | Ogawa ..................... | B66B 3/00 198/465.4 |

(Continued)

FOREIGN PATENT DOCUMENTS

| | | | |
|---|---|---|---|
| KR | 20160060455 A | * | 5/2016 |
| KR | 10-2018-0024445 | | 3/2018 |

(Continued)

OTHER PUBLICATIONS

Translation KR-20160060455-A (Year: 2016).*

(Continued)

*Primary Examiner* — Mark A Deuble

(57) ABSTRACT

According to an embodiment of the present invention, there is provided an article transport vehicle capable of speeding up and reducing vibration in a manufacturing plant, a rail assembly, and an article transport system including the same. The article transport vehicle that conveys an article between manufacturing facilities along a rail of an article transport system in a manufacturing plant includes an article holder, a vehicle body, a magnetic levitation actuator, and a linear motor coil.

18 Claims, 10 Drawing Sheets

(56) References Cited

U.S. PATENT DOCUMENTS

| | | | |
|---|---|---|---|
| 9,061,839 B2 * | 6/2015 | Murayama | H01L 21/67715 |
| 10,744,886 B2 | 8/2020 | Lee et al. | |
| 2022/0388771 A1 * | 12/2022 | Shiroishi | B65G 1/0407 |
| 2023/0159282 A1 * | 5/2023 | Lim | B65G 47/90 |
| | | | 414/751.1 |

FOREIGN PATENT DOCUMENTS

| | | | |
|---|---|---|---|
| KR | 10-2018-0059081 | | 6/2018 |
| KR | 20180060130 A | * | 6/2018 |
| KR | 10-2021-0008681 | | 1/2021 |

OTHER PUBLICATIONS

Translation KR-20180060130-A (Year: 2018).*
Office Action from the Korean Intellectual Property Office dated Feb. 20, 2024.

* cited by examiner

ARTICLE TRANSPORT VEHICLE, RAIL ASSEMBLY, AND ARTICLE TRANSPORT SYSTEM INCLUDING THE SAME

CROSS REFERENCE TO RELATED APPLICATION

The present application claims priority to Korean Patent Application No. 10-2021-0192607, filed Dec. 30, 2021 and Korean Patent Application No. 10-2022-0056053, filed May 6 2022, the entire contents of which are incorporated by reference herein for all purposes.

BACKGROUND OF THE INVENTION

1. Field of the Invention

The present invention relates to an article transport vehicle for transporting an article in a manufacturing plant, a rail assembly, and an article transport system including the same.

2. Description of the Related Art

A semiconductor or display manufacturing process is a process of manufacturing a final product through tens to hundreds of processing processes on a substrate (wafer or glass), and can be executed by a manufacturing facility that performs each process. When the process at a specific manufacturing facility is completed, the article (substrate) can be transported to the next manufacturing facility to proceed with the next process, and then can be stored in a storage facility for a predetermined period.

An article transport system refers to a system that transports or stores articles for manufacturing processes as described above, and can be broadly divided into a transport system that transports articles and a storage system that stores articles. An overhead hoist transport (OHT) system that travels along a rail installed on the ceiling is applied to a semiconductor manufacturing plant in the article transport system.

Meanwhile, an increase in production volume is required with the miniaturization of the semiconductor manufacturing process, and thus the high speed and low vibration of an article transport vehicle (OHT) become important. However, as the conventional vehicles face limitations, the introduction of a non-contact vehicle such as a magnetic levitation system has been discussed.

SUMMARY OF THE PRESENT DISCLOSURE

Therefore, according to an embodiment of the present invention, there is provided an article transport vehicle capable of speeding up and reducing vibration in a manufacturing plant, a rail assembly, and an article transport system including the same.

According to the present invention, an article transport vehicle that conveys an article between manufacturing facilities along a rail of an article transport system in a manufacturing plant includes an article holder including a space in which the article is accommodated, a vehicle body including a base plate rotatably coupled to the article holder, and a first side bar erected from an upper surface of the base plate and including a vertical bar extending in a vertical direction perpendicular to an upper surface of the base plate and a horizontal bar extending in a horizontal direction parallel to the upper surface of the base plate outwardly from an upper end of the vertical bar, a magnetic levitation actuator installed at the base plate and including a first horizontal magnetic levitation actuator attached at a side surface of the base plate, a second horizontal magnetic levitation actuator attached at the upper surface of the base plate and disposed at a region defined by the vertical bar, the horizontal bar, the upper surface of the base plate, and a linear motor coil installed at a side surface of the horizontal bar of the vehicle body.

According to an embodiment of the present disclosure, a rail assembly that provides a travel path of an article transport vehicle in an article transport system of a manufacturing plant, includes a yoke including a horizontal portion and a pair of vertical portions, each vertical portion of the pair of vertical portions being connected to a corresponding end of the horizontal portion, a side guide rail installed at a lower inner surface of each vertical portion of the pair of vertical portions of the yoke, and a linear motor magnet installed at an upper surface of the side guide rail.

According to an embodiment of the present disclosure, an article transport system of a manufacturing plant includes an article transport vehicle configured to transport an article between manufacturing facilities and a rail assembly configured to provide a travel path of the article transport vehicle. The rail assembly includes a yoke including a horizontal portion and a pair of vertical portions, each vertical portion of the pair of the vertical portions being connected to a corresponding end of the horizontal portion, a side guide rail installed at a lower inner surface of each vertical portion of the pair of vertical portions of the yoke, and a linear motor magnet installed at an upper surface of the side guide rail. The article transport vehicle includes an article holder including a space in which the article is accommodated, a vehicle body including a base plated rotatably coupled to the article holder, and a first side bar erected from an upper surface of the base plate and including a vertical bar extending in a vertical direction perpendicular to an upper surface of the base plate and a horizontal bar extending in a horizontal direction parallel to the upper surface of the base plate outwardly from an upper end of the vertical bar, a magnetic levitation actuator installed at the base plate and including a first horizontal magnetic levitation actuator attached at a side surface of the base plate, and a second horizontal magnetic levitation actuator attached at the upper surface of the base plate and disposed at a region defined by the vertical bar, the horizontal bar, the upper surface of the base plate, and a linear motor coil installed at a side surface of the horizontal bar of the vehicle body.

BRIEF DESCRIPTION OF THE DRAWINGS

The above and other objectives, features, and other advantages of the present disclosure will be more clearly understood from the following detailed description taken in conjunction with the accompanying drawings, in which.

DESCRIPTION OF THE PREFERRED EMBODIMENTS

Hereinafter, embodiments of the present invention will be described in detail with reference to the attached drawings to be easily implemented by those skilled in the art. The present invention may be implemented in various different forms and is not limited to the embodiments described herein.

In order to clearly describe the present invention, parts that are not related to the description will be omitted, and the same or similar components in this specification are denoted by the same reference sign.

In addition, in various embodiments, a component having the same configuration will be described only in a representative embodiment by using the same reference sign, and only a configuration that is different from that of the representative embodiment will be described in other embodiments.

In the entirety of this specification, a sentence that a portion is "connected (or coupled) to" another portion includes not only a case of "being directly connected (coupled)" but also a case of "being indirectly connected (coupled) with other members interposed therebetween". In addition, a sentence that a portion "includes" a component means that it may further include another component rather than excluding other components unless a particularly opposite statement is made.

Unless otherwise defined, all terms used herein, including technical or scientific terms, have the same meaning as generally understood by those skilled in the art. Terms such as those defined in a commonly used dictionary should be construed as having a meaning consistent with the meaning of the relevant technology, and should not be construed as an ideal or excessively formal meaning unless explicitly defined in this application.

Configurations of an article transport vehicle 10, a rail assembly 20, and an article transport system including the article transport vehicle 10 and the rail assembly 20 for non-contact traveling in a manufacturing plant according to the present invention will be described below.

Figure 1:
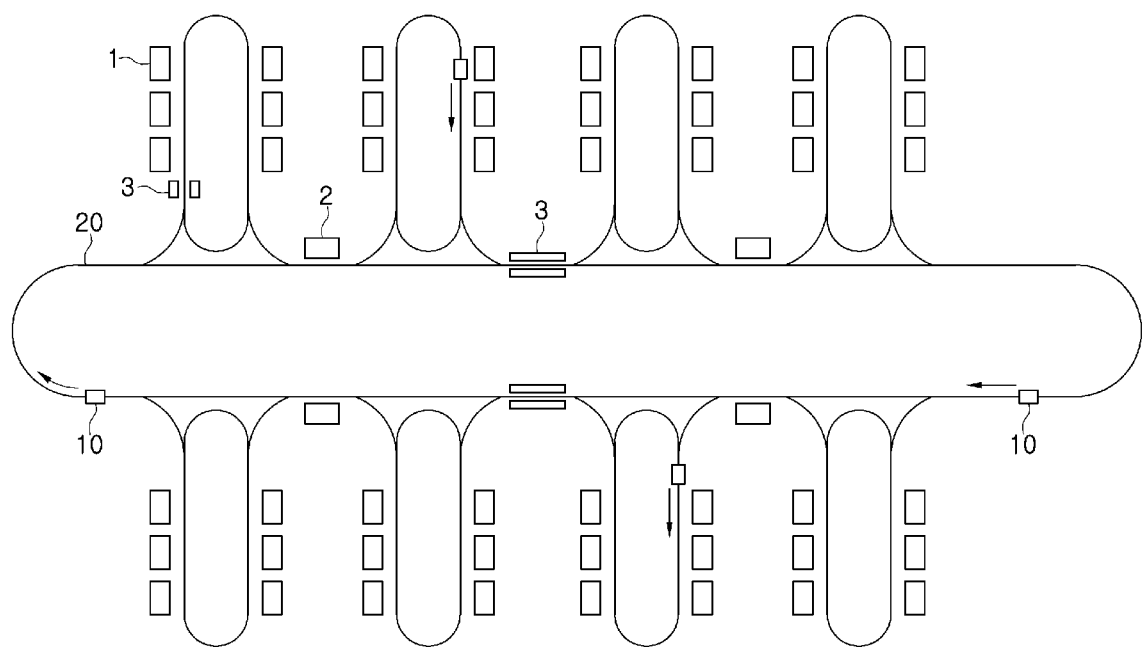
FIG. 1 illustrates an article transport system of a manufacturing plant according to the present invention.

FIG. 1 illustrates an article transport system of a manufacturing plant according to the present invention. A semiconductor manufacturing plant that manufactures semiconductor products will be described below as an example of a manufacturing plant to which the present invention is applied. The range of manufacturing plants to which the present invention can be applied is not limited to a specific type and can be applied to manufacturing plants of various industries. For example, the article transport system according to the present invention can be applied to various manufacturing plants of display panels, electronic devices, automobiles, secondary batteries, and the like.

The semiconductor manufacturing plant includes one or more clean rooms, and manufacturing facilities 1 for executing semiconductor manufacturing processes can be installed in each clean room. Generally, a finally processed substrate may be completed by repeatedly executing a plurality of manufacturing processes on a substrate (for example, a wafer). After the manufacturing process is completed at a specific semiconductor manufacturing facility, the substrate is transported to the manufacturing facility 1 for the next manufacturing process. Here, the wafer can be transported in a state of being stored in a transport container (for example, a front opening unified pod, FOUP) capable of accommodating a plurality of substrates. The transport container in which wafers are stored can be transported by an article transport vehicle 10. The article transport vehicle 10 may be referred to as an overhead hoist transport (OHT) that travels along rails installed on the ceiling.

With reference to FIG. 1, a manufacturing facility 1 for executing a process in a semiconductor manufacturing plant is installed, and an article transport vehicle 10 that transports an article between the manufacturing facilities 1 and a rail assembly 20 that provides a travel path of the article transport vehicle 10 are provided. Here, when the article transport vehicle 10 transports an article between the manufacturing facilities 1, the article may be immediately transported from the specific manufacturing facility to another manufacturing facility, or may be transported to another manufacturing facility after being stored in a storage device.

As the storage device, a stocker 2 in the form of a rack arranged in a duplex layer may be used. In addition, temporary storage facilities 3 such as a side track buffer installed on the side of the rail assembly and an under track buffer installed at the lower portion of the rail assembly 20 may be provided as the storage device.

Generally, the article transport vehicle 10 travels by rotating with a travel wheel in contact with the rail. In addition, the article transport vehicle 10 selectively travels in a specific direction by causing a steering wheel located above a branch area of the travel path to come into contact with a steering guide rail.

In the case of general contact driving and steering methods, vibration and an impact may occur due to the contact between the wheel and the rail, and there is a risk of failure if the vibration and impact are transmitted to the wafer. In addition, as the traveling speed of the article transport vehicle 10 increases, the vibration and the impact generated by the contact between the wheel and the rail increase. Thus, there is a problem that the traveling speed of the article transport vehicle 10 is limited. In addition, various particles may be generated due to the contact between the wheel and the rail, which may be a factor that hinders the clean environment of the manufacturing plant.

Thus, the embodiment of the present invention provides an article transport vehicle 10 capable of performing traveling and steering in a non-contact manner. According to the present invention, friction does not occur between the article transport vehicle 10 and the rail assembly 20. Thus, it is possible to prevent an occurrence of vibration and an impact. Therefore, it is possible to prevent transmission of the vibration and the impact to the article, and to increase the traveling speed of the article transport vehicle 10. In addition, since generation of particles due to the contact between the wheel and the rail is prevented, it is possible to maintain a clean environment in the manufacturing plant.

The article transport vehicle 10 may travel along the rail assembly 20 installed in a manufacturing plant, and receive an article from the manufacturing facility 1 and convey the article to another manufacturing facility 1. The article transport vehicle 10 may be roughly configured by a traveling part for movement and an article handling part for loading and unloading an article. The article handling part may include a hand unit that grasps an article, a slide unit that horizontally moves the hand unit toward a load port of the manufacturing facility 1, and a belt-type hoist unit that raises and lowers the hand unit. However, since the present invention relates to the configuration of the article transport vehicle 10 for traveling and steering in a non-contact manner, the description of the configuration for handling the article will be omitted, and various structures for handling the article can be applied.

The traveling part of the article transport vehicle 10 may include a drive device for acceleration, deceleration, braking, steering, and the like of the article transport vehicle 10, and a controller that controls the drive device. The traveling parts of the article transport vehicle 10 may be configured in front and rear, respectively, based on the traveling direction of the article transport vehicle 10. That is, the front traveling part and the rear traveling part constitute one body to convey an article, and the front traveling part and the rear traveling part may operate in cooperation with each other. In the present invention, for easy description, one traveling part will be described without distinguishing the front and rear traveling parts from each other. The present invention can be applied to an article transport vehicle 10 configured by two or more traveling parts.

Figure 2:
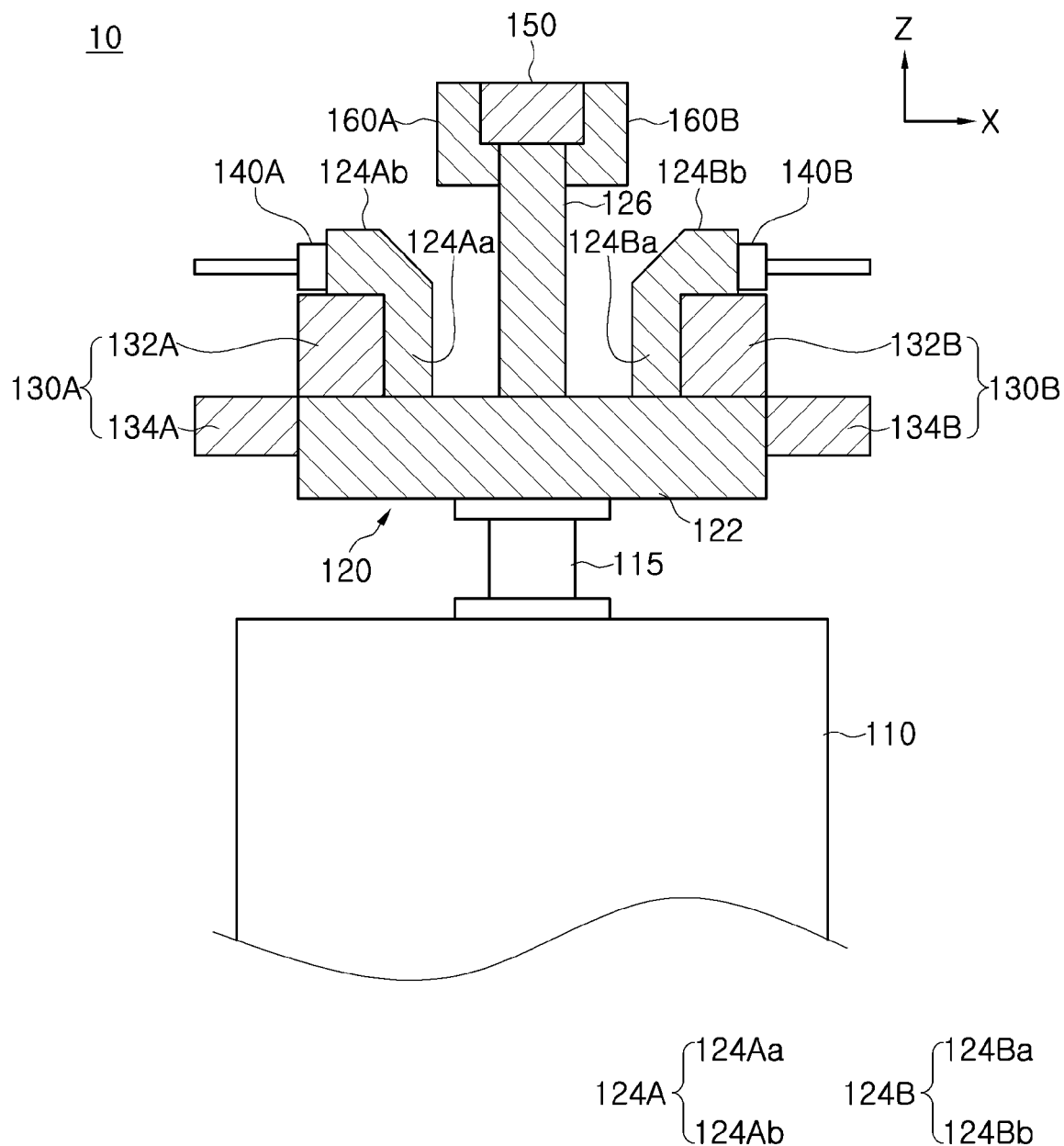
FIG. 2 schematically illustrates an article transport vehicle that conveys an article between manufacturing facilities in the article transport system of a manufacturing plant according to the present invention.
Figure 3:
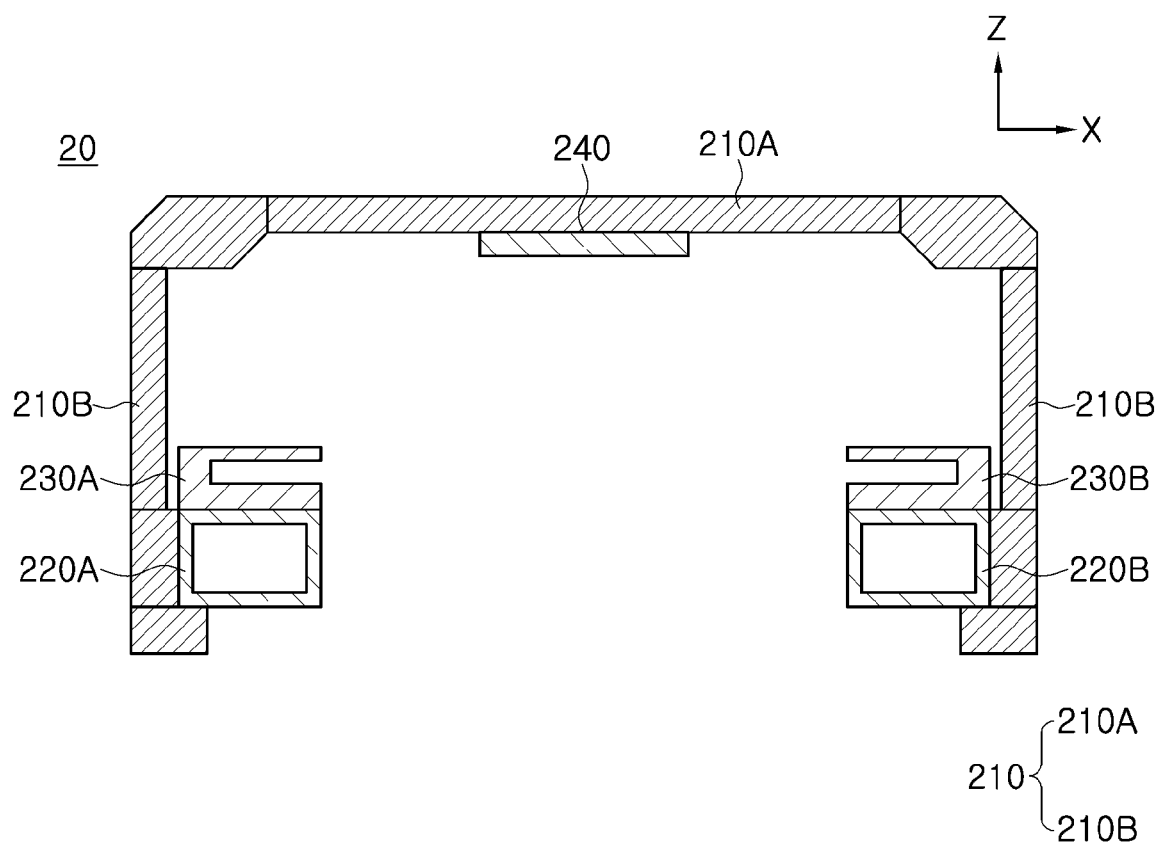
FIG. 3 schematically illustrates a rail assembly that provides a travel path of the article transport vehicle in the article transport system of a manufacturing plant according to the present invention.

FIGS. 2 and 3 schematically illustrate the structures of the article transport vehicle 10 that conveys an article between the manufacturing facilities 1 and the rail assembly 20 that provides the travel path of the article transport vehicle 10 in the article transport system of a manufacturing plant according to the present invention.

The article transport system of a manufacturing plant according to the present invention includes the article transport vehicle 10 that conveys an article between manufacturing facilities and the rail assembly 20 that provides a travel path of the article transport vehicle 10.

The rail assembly 20 includes a yoke 210 installed along the travel path, side guide rails 220A and 220B installed on a lower inner surface of the yoke 210, and linear motor magnets 230A and 230B installed at upper portions of the side guide rails 220A and 220B. The yoke 210 includes a horizontal portion 210A and a pair of vertical portions 210B, each vertical portion of the pair of vertical portions 210B being connected to a corresponding end of the horizontal portion 210A. The side guide rails 220A and 220B are installed at a lower inner surface of each vertical portion of the pair of vertical portions 210B of the yoke 210. The linear motor magnets 230A and 230B are installed at an upper surface of the side guide rails 220A and 220B.

The article transport vehicle 10 includes an article holder 110 that provides a space in which the article is accommodated, a vehicle body 120 that is rotatably coupled above the article holder 110, magnetic levitation actuators 130A and 130B that are installed at the vehicle body 120 and control a gap to the side guide rails 220A and 220B by generating attractive force on the side guide rails 220A and 220B, and linear motor coils 140A and 140B that generate a driving force by interacting with the linear motor magnets 230A and 230B. In an embodiment, the article holder 110 may accommodate an FOUP storing wafers or substrates to be transferred and protect the wafers from external impact, for example. The article holder 110 may be referred to as an FOUP holder. The linear motor magnets 230A and 230B include recesses toward the lower inner surface of the yoke 210.

The rail assembly 20 provides the travel path for traveling of the article transport vehicle 10 and may be installed on the ceiling of the manufacturing plant.

The side guide rails 220A and 220B are configured to interact with the magnetic levitation actuators 130A and 130B that perform levitation and posture control of the article transport vehicle 10. The linear motor magnets 230A and 230B are configured to interact with the linear motor coils 140A and 140B that generate a driving force of the article transport vehicle 10. Each of the side guide rails 220A and 220B has rectangular shape having inner vertical surface and lower horizontal surface.

The rail assembly 20 may include an upper guide rail 240 installed at the center of the yoke 210. The upper guide rail 240 is attached to a center of a lower surface of the horizontal portion of the yoke 210. The upper guide rail 240 is configured to interact with a gravity compensation actuator 150 for levitation of the article transport vehicle 10. As illustrated in FIGS. 7 to 10, the upper guide rail 240 is configured to be branched in the traveling direction in a branch area of the travel path. The upper guide rail is branched into two directions including a straight direction and a curved direction. For reference, FIG. 7 to 10 illustrate a branch traveling process of the article transport vehicle 10 when viewed from the top in the branch area of the travel path.

The article transport vehicle 10 may travel along the travel path formed by the rail assembly 20.

The article holder 110 may be configured to protect the article being conveyed from an external object by forming a space for accommodating the article in the article holder 110. Based on the traveling direction of the article transport vehicle 10, the left and right sides of the article holder 110 may be opened so that the article may slidably move. Structures for protecting the article may be provided in the front and rear of the article holder 110. Electronic devices (for example, a camera, a distance sensor, a reader) necessary for traveling of the article transport vehicle 10 can be installed in front and rear of the article holder 110.

Figure 9:
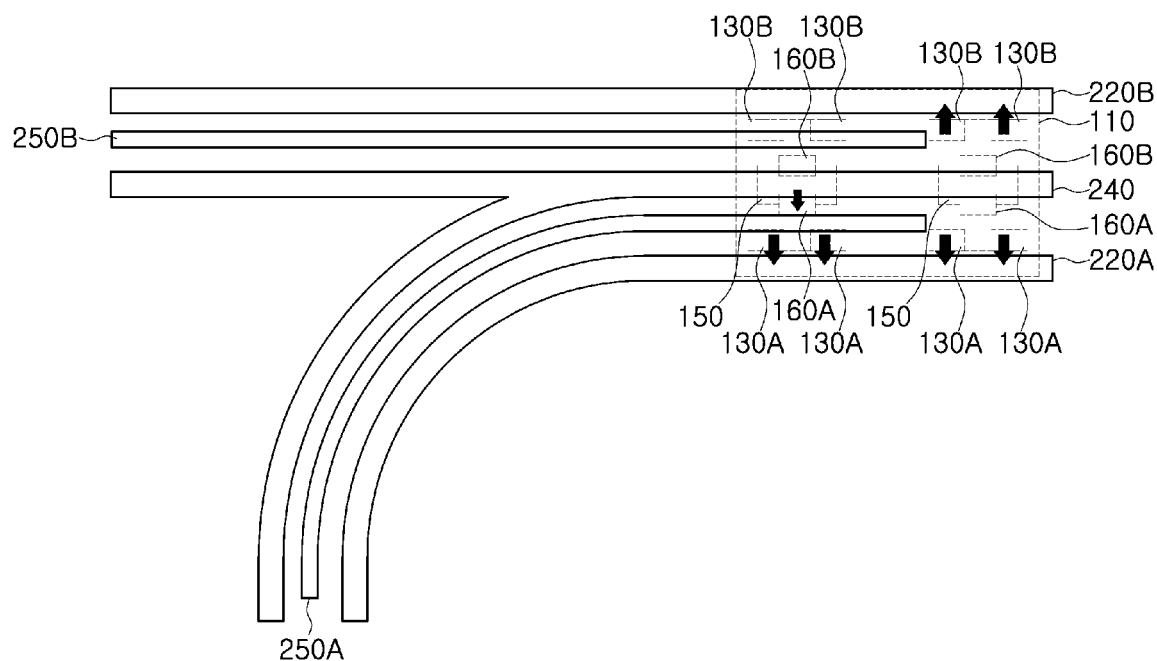
FIGS. 9 and 10 are diagrams for explaining an operation of the article transport vehicle traveling in a curved direction in the branch traveling section in the article transport system of a manufacturing plant according to the present invention.
Figure 10:
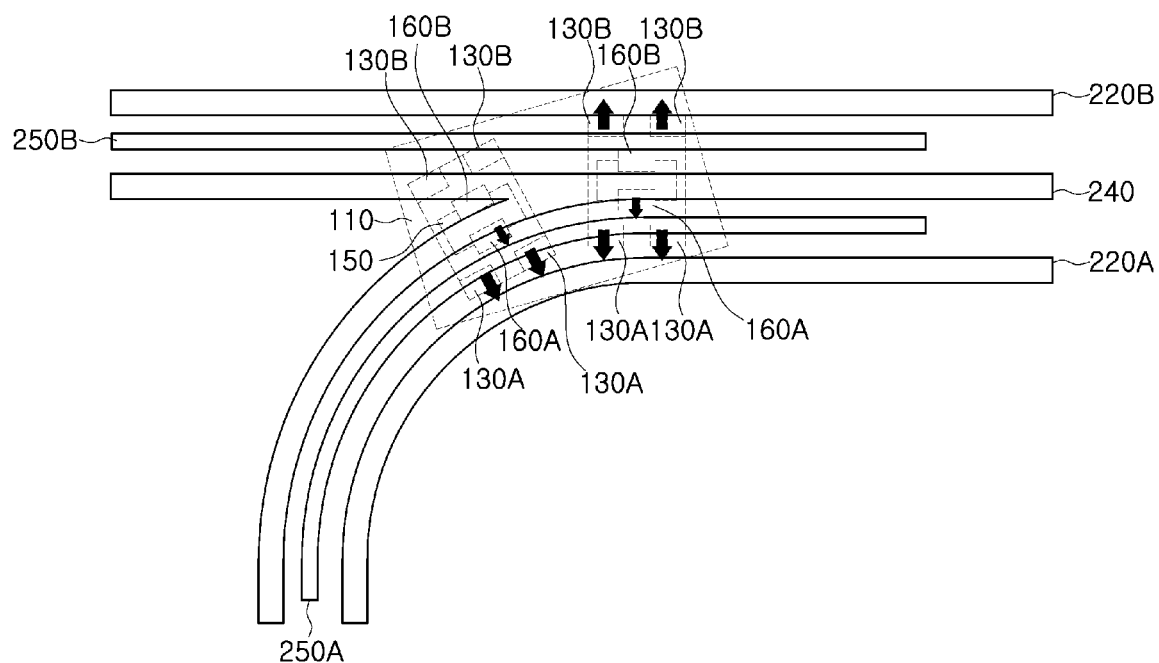

Meanwhile, the article holder 110 is coupled to the vehicle body 120 by a rotation mechanism 115, and the rotation mechanism 115 couples the article holder 110 on the lower side and the vehicle body 120 on the upper side to be rotatably with each other. The article holder 110 and the vehicle body 120 can rotate around the rotation axis formed by the rotation mechanism 115. That is, a direction in which the vehicle body 120 is directed and a direction in which the article holder 110 is directed may be different from each other, which enables smooth traveling during curved traveling of the article transport vehicle 10 as illustrated in FIGS. 9 and 10 described later.

The vehicle body 120 is a vehicle body for traveling of the article transport vehicle 10, and a drive device for driving, and a device for communication and control may be installed at the vehicle body 120. As described above, the vehicle bodies 120 may be provided in front and rear of the article transport vehicle 10, respectively. The vehicle body 120 may transport the article by supporting the article holder 110 at the top through the rotation mechanism 115.

According to the embodiment of the present invention, the vehicle body 120 may include a base plate 122 that is provided in a predetermined shape and is rotatably coupled to the article holder 110 through the rotation mechanism 115, and side bars 124A and 124B formed on both sides of the base plate 122. As illustrated in FIG. 2, the base plate 122 may be coupled to the article holder 110 through the rotation mechanism 115, and the side bars 124A and 124B may be installed on the upper left side and the upper right side of the base plate 122, respectively. The base plate 122 and the side bars 124A and 124B may be integrally configured or may be assembled after individual production.

Referring to FIG. 2, first side bar 124A and second side bar 124B are erected from an upper surface of the base plate. The first side bar 124A includes a vertical bar 124Aa extending in a vertical direction perpendicular to an upper surface of the base plate 122 and a horizontal bar 124Ab extending in a horizontal direction parallel to the upper surface of the base plate 122 outwardly from an upper end of the vertical bar 124Aa. Similarly, the second side bar 124B includes a vertical bar 124Ba extending in a vertical direction perpendicular to an upper surface of the base plate 122 and a horizontal bar 124Bb extending in a horizontal direction parallel to the upper surface of the base plate 122 outwardly from an upper end of the vertical bar 124Ba. The second side bar 124B is erected from the upper surface of the base plate 122 and spaced apart from the first side bar 124A in the horizontal direction.

The rotation mechanism 115 rotatably connects a lower surface of the base plate 122 to the article holder 110.

Additionally, the vehicle body 120 may further include a vertical rotation shaft 126 that extends upward from the center of the base plate 122. A gravity compensation actuator 150 that is formed at the upper portion of the vertical rotation shaft 126 and generates attractive force corresponding to the load of the article transport vehicle 10 may be provided. Branch auxiliary actuators 160A and 160B that assist the steering of the article transport vehicle 10 may be provided on both sides of the gravity compensation actuator 150.

The magnetic levitation actuators 130A and 130B apply an electrical signal to the coil to generate attractive force by an interaction with a magnetic body such as an electromagnet.

The magnetic levitation actuators 130A and 130B may control the gap to the side guide rail 220 by generating attractive force on the side guide rail 220 installed along the travel path of the article transport vehicle 10. The magnetic levitation actuators 130A and 130B may interact with the side guide rail 220 to generate attractive force. With reference to FIG. 2, the magnetic levitation actuators 130A and 130B may be provided on the left and right sides of the traveling direction of the article transport vehicle 10.

According to the embodiment of the present invention, the horizontal magnetic levitation actuators 130A and 130B may include first horizontal magnetic levitation actuators 134A and 134B that are installed adjacent to lower portions of the side guide rails 220A and 220B on both sides of the base plate 122 and control the gap with the side guide rails 220A and 220B in a vertical direction, and second horizontal magnetic levitation actuators 132A and 132B that are installed adjacent to sides of the side guide rails 220A and 220B on outer sides of the side bars 124A and 124B and control the gap with the side guide rails 220A and 220B in a horizontal direction. The first horizontal magnetic levitation actuators 134A and 134B are attached at a side surface of the base plate. The second horizontal magnetic actuators 132A and 132B are attached at the upper surface of the base plate 122 and disposed at a region defined by the vertical bars 124Aa and 124Ba, the horizontal bars 124Ab and 124Bb, the upper surface of the base plate 122.

With reference to FIG. 2, the second horizontal magnetic levitation actuators 132A and 132B may be provided on the outer sides of the side bars 124A and 124B, and the first horizontal magnetic levitation actuators 134A and 134B may be provided on both sides of the base plate 122. The second horizontal magnetic levitation actuators 132A and 132B may uniformly maintain the gap between the article transport vehicle 10 and the side guide rails 220A and 220B by evenly generating attractive force on the side guide rails 220A and 220B. Although not illustrated, a gap sensor that detects a horizontal (X-direction) gap between the article transport vehicle 10 and the side guide rails 220A and 220B may be provided, and attractive force of the second horizontal magnetic levitation actuators 132A and 132B may be controlled in response to the horizontal distance measured by the gap sensor.

The first horizontal magnetic levitation actuators 134A and 134B may generate attractive force corresponding to the load of the article transport vehicle 10 with respect to the side guide rails 220A and 220B. Similarly, a gap sensor that detects a vertical (Z-direction) gap between the article transport vehicle 10 and the side guide rails 220A and 220B may be provided, and attractive force of the second horizontal magnetic levitation actuators 132A and 132B may be controlled in response to the vertical distance measured by the gap sensor.

That is, the magnetic levitation actuators 130A and 130B may perform vertical levitation and horizontal position control of the article transport vehicle 10.

Figure 5:
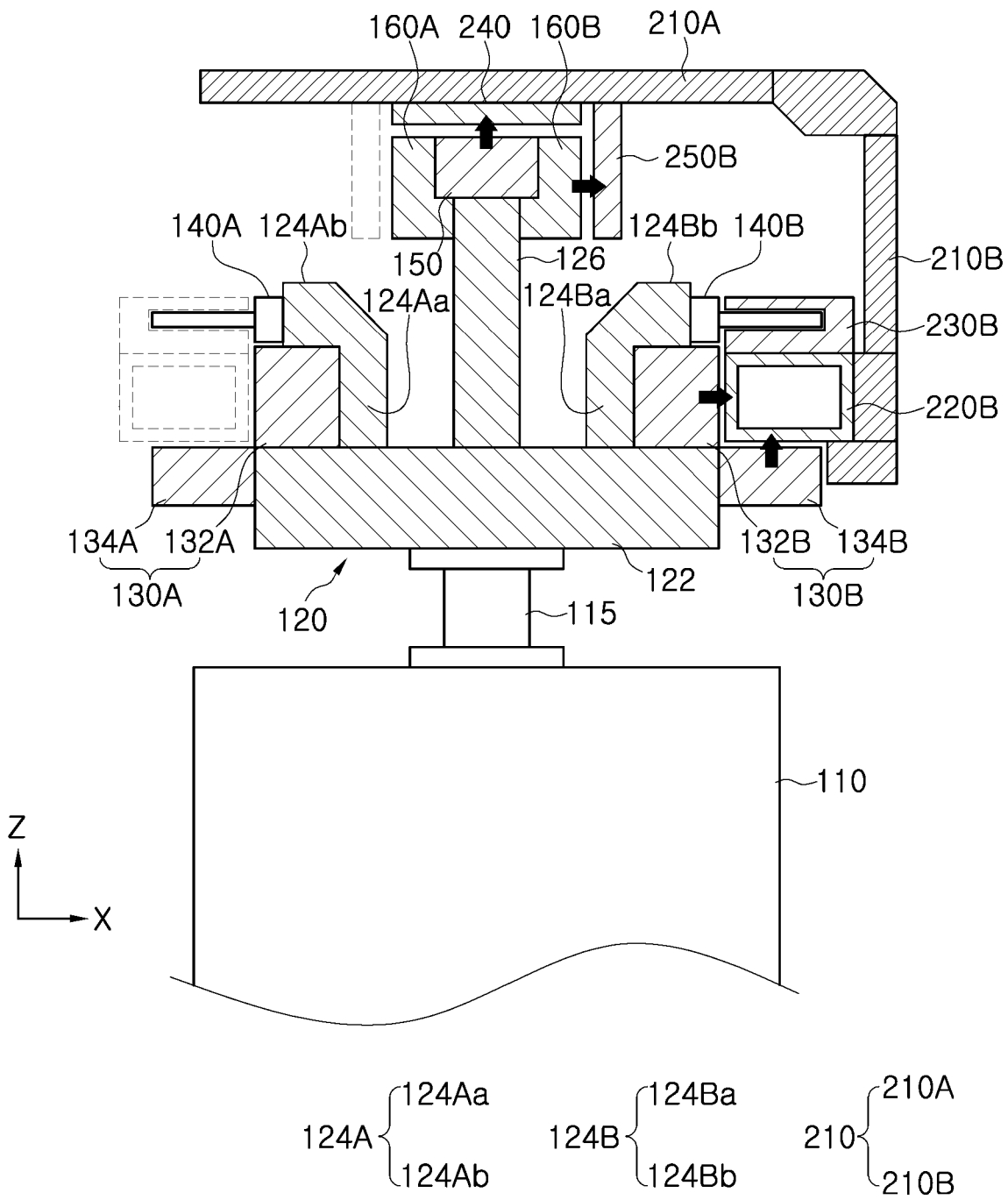
FIGS. 5 and 6 are diagrams for explaining an operation of the article transport vehicle in a branch traveling section in the article transport system of a manufacturing plant according to the present invention.
Figure 7:
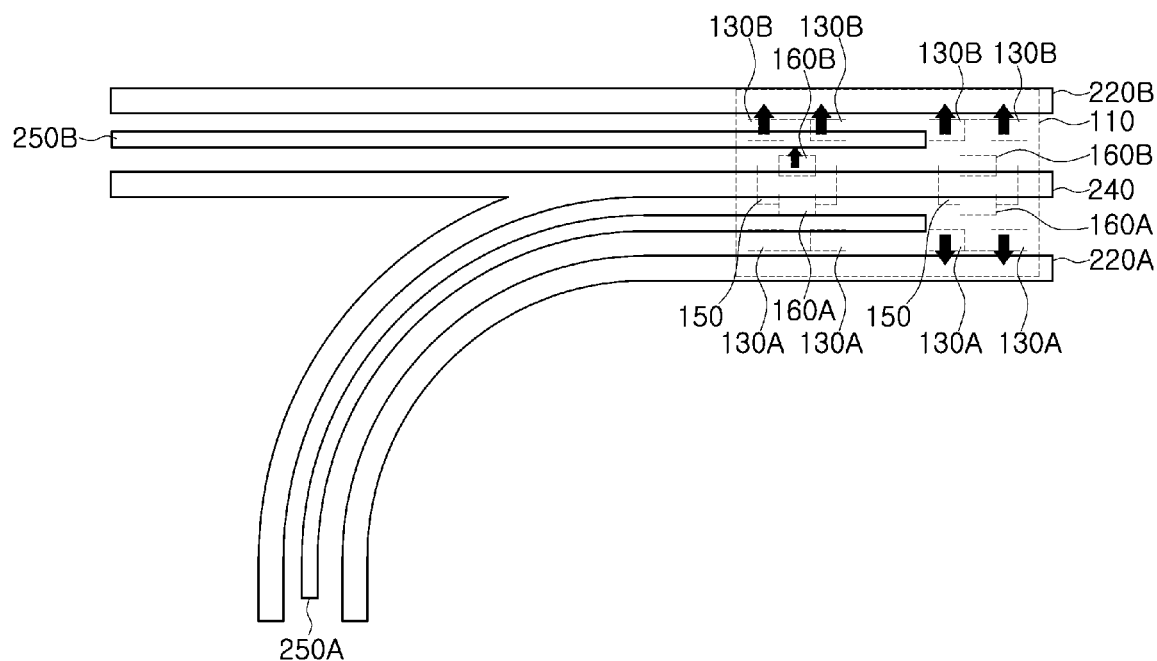
FIGS. 7 and 8 are diagrams for explaining an operation of the article transport vehicle traveling in a straight direction in the branch traveling section in the article transport system of a manufacturing plant according to the present invention.
Figure 8:
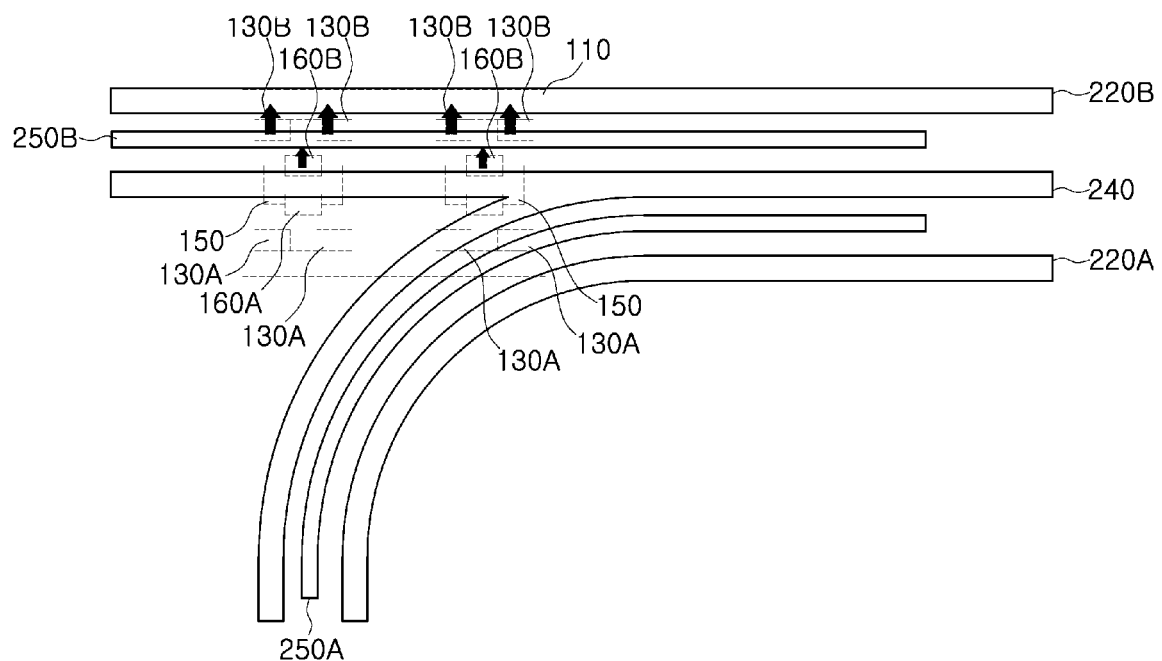

In addition, the magnetic levitation actuators 130A and 130B may selectively generate attractive force on the side guide rails 220A and 220B in accordance with the traveling direction in which the article transport vehicle is to travel in the branch area of the travel path. For example, when the article transport vehicle intends to travel in the right direction in the branch area as illustrated in FIG. 5, the right magnetic levitation actuator 130B is activated to generate attractive force to the right side guide rail 220B. Since the left magnetic levitation actuator 130A is deactivated, the article transport vehicle 10 can move along the right side guide rail 220B. With reference to FIGS. 7 and 8, when the article transport vehicle travels in a straight direction (right direction) in the branch area, the right magnetic levitation actuator 130B is activated to generate attractive force to the right side guide rail 220B, and thus the article transport vehicle 10 can travel in the straight direction. That is, the magnetic levitation actuators 130A and 130B are configured to generate attractive force based on a travel direction of the article transport vehicle 10.

Figure 6:
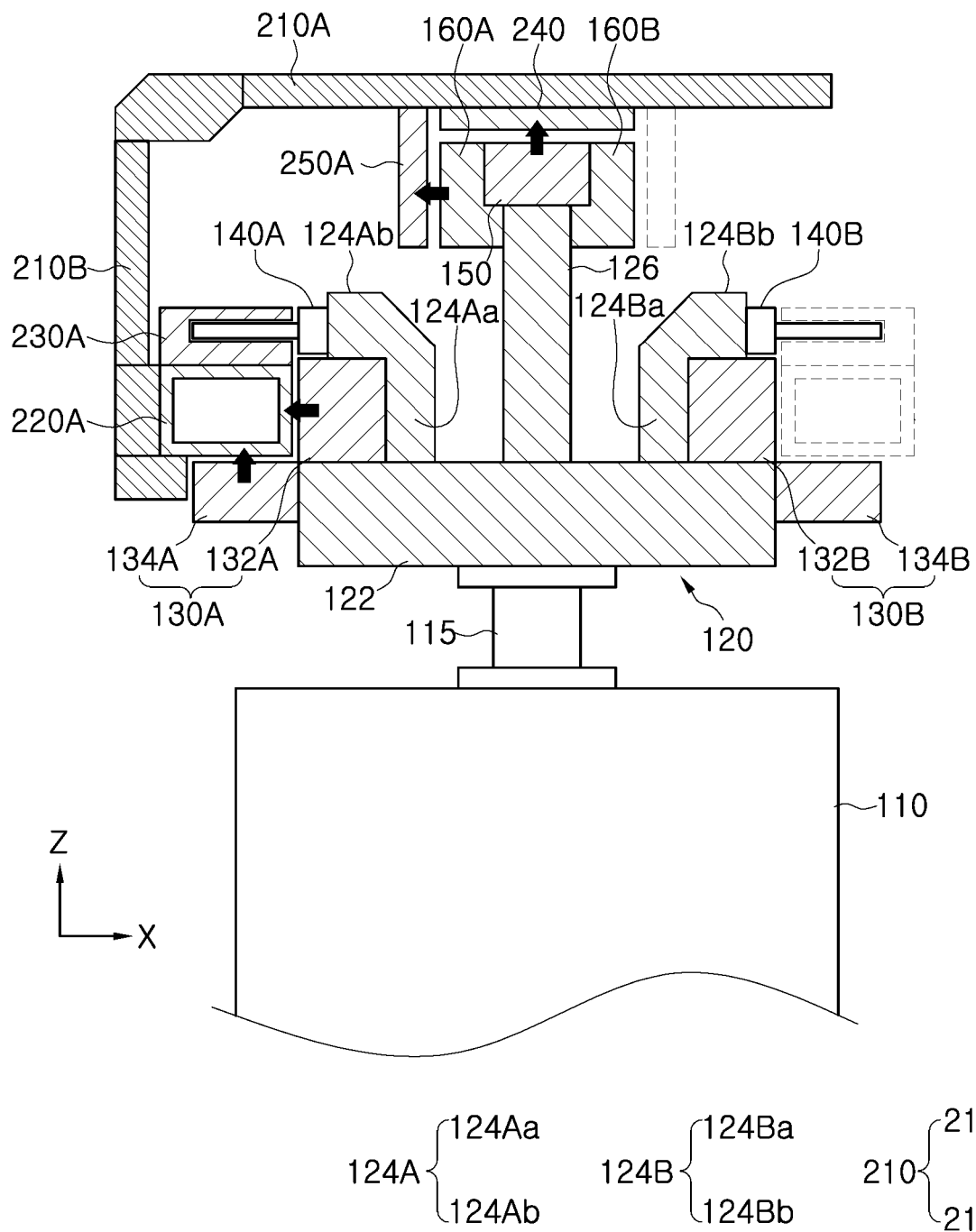

In addition, when the article transport device intends to travel in the left direction in the branch area as illustrated in FIG. 6, the left magnetic levitation actuator 130A is activated to generate attractive force to the left side guide rail 220A. Since the right magnetic levitation actuator 130B is deactivated, the article transport vehicle 10 can move along the left side guide rail 220A. With reference to FIGS. 9 and 10, when the article transport vehicle travels in a curved direction (left direction) in the branch area, the left magnetic levitation actuator 130A is activated to generate attractive force to the left side guide rail 220A, and thus the article transport vehicle 10 can travel in the straight direction.

The linear motor coils 140A and 140B may generate a driving force for traveling by an interaction with the linear motor magnets 230A and 230B. The linear motor coils 140A and 140B extend in the horizontal direction from the side surface of the horizontal bars 124Aa and 124Ba of the vehicle body 120.

Figure 4:
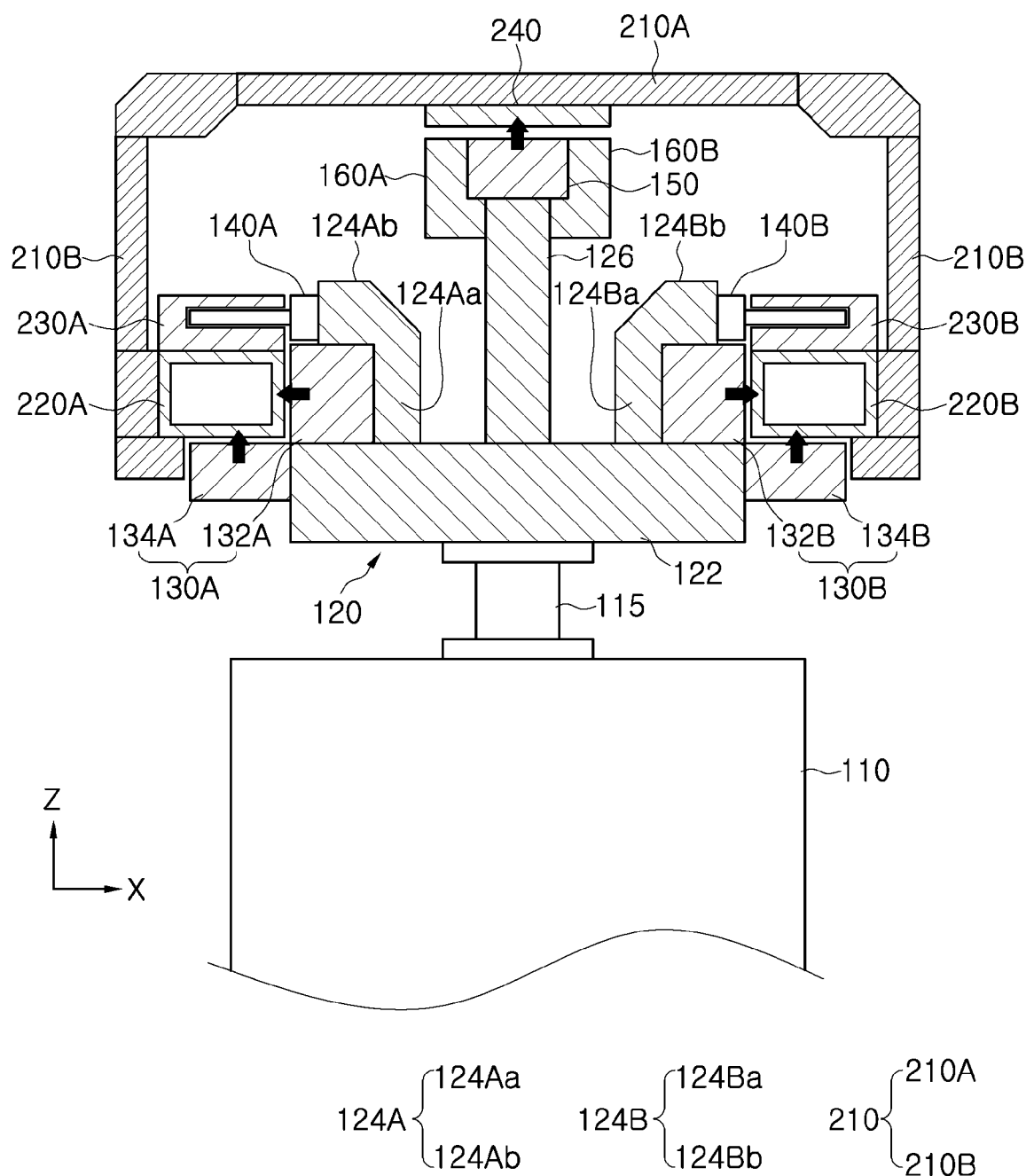
FIG. 4 is a diagram for explaining an operation of the article transport vehicle in a straight traveling section in the article transport system of a manufacturing plant according to the present invention.

According to the embodiment of the present invention, the linear motor coils 140A and 140B may be configured to be fixed to the outsides of the side bars 124A and 124B and inserted into a recess recessed in the linear motor magnet 230 at a predetermined distance. With reference to FIG. 4, the linear motor coils 140A and 140B are installed to be fixed to the outer horizontal surfaces of the side bars 124A and 124B, and the protruding portions of the linear motor coils 140A and 140B may be inserted into a recess recessed in the linear motor magnet 230B. The linear motor coils 140A and 140B and the linear motor magnets 230B may be designed to maintain a constant gap.

That is, the linear motor coils 140A and 140B generate a driving force for traveling of the article transport vehicle 10.

According to the embodiment of the present invention, the magnetic levitation actuators 130A and 130B may selectively generate attractive force on the side guide rails 220A and 220B in accordance with the traveling direction in which the article transport vehicle is to travel in the branch area of the travel path.

According to the embodiment of the present invention, the vehicle body 120 in the article transport vehicle 10 may further include the vertical rotation shaft 126 that is coupled with the rotation mechanism 115 and extends over the base plate 122. With reference to FIG. 2, the vertical rotation shaft 126 is configured to extend in the vertical direction (Z-direction) from the rotation shaft of the rotation mechanism 115. The vertical rotation shaft 126 is erected from the upper surface of the base plate 122. The vertical rotation shaft 126 is connected to the rotation mechanism 115.

According to the embodiment of the present invention, the article transport vehicle 10 may further include the gravity compensation actuator 150 that is formed at an upper portion of the vertical rotation shaft 126 and generates attractive force to the upper guide rail 240 installed at an upper portion of the yoke 210 installed along a movement path of the article transport vehicle 10. The gravity compensation actuator 150 may generate attractive force corresponding to the load of the article transport vehicle 10 by the interaction with the upper guide rail 240. The gravity compensation actuator 150 is disposed at an upper end of the vertical rotation shaft 126.

The rail assembly 20 may further include a pair of branch guide rails 250A and 250B installed on one sides of the traveling direction in the branch area, respectively. The pair of the branch guide rails 250A and 250B are installed at the lower surface of the horizontal portion of the yoke 210 and extending downwardly from the lower surface of the horizontal portion 210A of the yoke 210. The pair of the branch guide rails 250A and 250B are adjacent to opposite sides of the upper guide rail 240.

The article transport vehicle 10 may further include the branch auxiliary actuators 160A and 160B that are provided on both sides of the gravity compensation actuator 150 and selectively generate attractive force on the branch guide rails 250A and 250B installed on one sides of the upper guide rail 240 in accordance with the traveling direction in the branch area of the travel path. The branch auxiliary actuators 160A and 160B are provided on opposite sides of the gravity compensation actuator 150.

The branch auxiliary actuators 160A and 160B determine the traveling direction of the article transport vehicle 10 in the branch area, together with the magnetic levitation actuators 130A and 130B.

For example, when the article transport vehicle 10 intends to travel in the right direction as illustrated in FIG. 5, the right magnetic levitation actuator 130B is activated to generate attractive force on the right branch guide rail 250B. With reference to FIGS. 7 and 8, when the article transport vehicle 10 intends to travel in the straight direction (right direction), the right branch auxiliary actuator 160B is activated together with the right magnetic levitation actuator 130B to allow the article transport vehicle 10 to travel in the straight direction.

In addition, when the article transport vehicle 10 intends to travel in the left direction as illustrated in FIG. 6, the left magnetic levitation actuator 130A is activated to generate attractive force on the left branch guide rail 250A. With reference to FIGS. 9 and 10, when the article transport vehicle 10 intends to travel in the curved direction (left direction), the left branch auxiliary actuator 160A is activated together with the left magnetic levitation actuator 130A to allow the article transport vehicle 10 to travel in the curved direction (left direction).

It will be apparent that the present embodiment and the drawings attached to this specification just clearly represent a part of the technical spirit included in the present invention, and all modification examples and specific embodiments that can be easily inferred by those skilled in the art within the scope of the technical spirit contained in the specification and drawings of the present invention are included in the scope of the present invention.

Therefore, the spirit of the present invention should not be limited to the described embodiments, and not only the claims to be described later, but also all those that have equal or equivalent modifications to the claims will be said to belong to the scope of the spirit of the present invention.

What is claimed is:

1. An article transport vehicle that conveys an article between manufacturing facilities along a rail of an article transport system in a manufacturing plant, the article transport vehicle comprising:
    an article holder including a space in which the article is accommodated;
    a vehicle body including:
    a base plate rotatably coupled to the article holder; and
    a first side bar erected from an upper surface of the base plate and including a vertical bar extending in a vertical direction perpendicular to an upper surface of the base plate and a horizontal bar extending in a horizontal direction parallel to the upper surface of the base plate outwardly from an upper end of the vertical bar;
    a magnetic levitation actuator installed at the base plate and including:
    a first horizontal magnetic levitation actuator attached at a side surface of the base plate; and
    a second horizontal magnetic levitation actuator attached at the upper surface of the base plate and disposed at a region defined by the vertical bar, the horizontal bar, and the upper surface of the base plate; and
    a linear motor coil installed at a side surface of the horizontal bar of the vehicle body.

2. The article transport vehicle according to claim 1, further comprising:
    a rotation mechanism rotatably connecting a lower surface of the base plate to the article holder; and
    a second side bar erected from the upper surface of the base plate and spaced apart from the first side bar in the horizontal direction.

3. The article transport vehicle according to claim 1, wherein the linear motor coil extends in the horizontal direction from the side surface of the horizontal bar of the vehicle body.

4. The article transport vehicle according to claim 1, further comprising:
a vertical rotation shaft erected from the upper surface of the base plate; and
a gravity compensation actuator disposed at an upper end of the vertical rotation shaft.

5. The article transport vehicle according to claim 1, wherein the magnetic levitation actuator is configured to generate attractive force based on a travel direction of the article transport vehicle.

6. The article transport vehicle according to claim 2, further comprising:
a vertical rotation shaft erected from the upper surface of the base plate and connected to the rotation mechanism.

7. The article transport vehicle according to claim 6, further comprising:
a gravity compensation actuator formed at an upper portion of the vertical rotation shaft.

8. The article transport vehicle according to claim 7, further comprising:
a branch auxiliary actuator provided on opposite sides of the gravity compensation actuator.

9. A rail assembly that provides a travel path of an article transport vehicle in an article transport system of a manufacturing plant, the rail assembly comprising:
a yoke including a horizontal portion and a pair of vertical portions, each vertical portion of the pair of vertical portions being connected to a corresponding end of the horizontal portion;
a side guide rail installed at a lower inner surface of each vertical portion of the pair of vertical portions of the yoke; and
a linear motor magnet installed at an upper surface of the side guide rail;
an upper guide rail attached to a center of a lower surface of the horizontal portion of yoke; and
a pair of branch guide rails installed at the lower surface of the horizontal portion of the yoke and extending downwardly from the lower surface of the horizontal portion of the yoke,
wherein the pair of branch guide rails are adjacent to opposite sides of the upper guide rail, and
wherein the pair of branch guide rails directly contact the lower surface of the horizontal portion of the yoke.

10. The rail assembly according to claim 9, wherein the linear motor magnet includes a recess toward the lower inner surface of the yoke.

11. The rail assembly according to claim 9, wherein the side guide rail has rectangular shape having inner vertical surface and lower horizontal surface.

12. The rail assembly according to claim 9, wherein the upper guide rail is branched into two directions including a straight direction and a curved direction.

13. An article transport system of a manufacturing plant, the article transport system comprising:
an article transport vehicle configured to transport an article between manufacturing facilities; and
a rail assembly configured to provide a travel path of the article transport vehicle,
wherein the rail assembly includes:
a yoke including a horizontal portion and a pair of vertical portions, each vertical portion of the pair of vertical portions being connected to a corresponding end of the horizontal portion;
a side guide rail installed at a lower inner surface of each vertical portion of the pair of vertical portions of the yoke; and
a linear motor magnet installed at an upper surface of the side guide rail, and
wherein the article transport vehicle includes:
an article holder including a space in which the article is accommodated;
a vehicle body including:
a base plate rotatably coupled to the article holder; and
a first side bar erected from an upper surface of the base plate and including a vertical bar extending in a vertical direction perpendicular to an upper surface of the base plate and a horizontal bar extending in a horizontal direction parallel to the upper surface of the base plate outwardly from an upper end of the vertical bar;
a magnetic levitation actuator installed at the base plate and including:
a first horizontal magnetic levitation actuator attached at a side surface of the base plate; and
a second horizontal magnetic levitation actuator attached at the upper surface of the base plate and disposed at a region defined by the vertical bar, the horizontal bar, the upper surface of the base plate; and
a linear motor coil installed at a side surface of the horizontal bar of the vehicle body.

14. The article transport system according to claim 13, wherein the article transport vehicle further comprising:
a rotation mechanism rotatably connect a lower surface of the base plate to the article holder; and
a second side bar erected from the upper surface of the base plate and spaced apart from the first side bar in the horizontal direction.

15. The article transport system according to claim 13, wherein the linear motor coil extends in the horizontal direction from the side surface of the horizontal bar of the vehicle body.

16. The article transport system according to claim 13, wherein the article transport vehicle further comprises:
a vertical rotation shaft erected from the upper surface of the base plate; and
a gravity compensation actuator disposed at an end of the vertical rotation shaft.

17. The article transport system according to claim 13, wherein
the magnetic levitation actuator is configured to generate attractive force based on a travel direction of the article transport vehicle.

18. The article transport system according to claim 16, Wherein the article transport vehicle further comprises a branch auxiliary actuator provided on opposite sides of the gravity compensation actuator.

* * * * *